(12) United States Patent
Cambou et al.

(10) Patent No.: US 8,933,750 B2
(45) Date of Patent: Jan. 13, 2015

(54) MAGNETIC LOGIC UNITS CONFIGURED AS AN AMPLIFIER

(71) Applicant: Crocus Technology Inc., Santa Clara, CA (US)

(72) Inventors: Bertrand F. Cambou, Palo Alto, CA (US); Douglas J. Lee, San Jose, CA (US); Ken Mackay, Le Sappey en Chartreuse (FR)

(73) Assignee: Crocus Technology Inc., Santa Clara, CA (US)

( * ) Notice: Subject to any disclaimer, the term of this patent is extended or adjusted under 35 U.S.C. 154(b) by 97 days.

(21) Appl. No.: 13/769,156

(22) Filed: Feb. 15, 2013

(65) Prior Publication Data

US 2013/0241636 A1    Sep. 19, 2013

Related U.S. Application Data

(60) Provisional application No. 61/600,548, filed on Feb. 17, 2012.

(51) Int. Cl.
| | |
|---|---|
| *H03F 15/00* | (2006.01) |
| *G11C 11/02* | (2006.01) |
| *G11C 11/14* | (2006.01) |
| *G11C 11/15* | (2006.01) |
| *G11C 11/16* | (2006.01) |

(52) U.S. Cl.
CPC ............... *H03F 15/00* (2013.01); *G11C 11/02* (2013.01); *G11C 11/14* (2013.01); *G11C 11/15* (2013.01); *G11C 11/16* (2013.01)

USPC ............................................................ 330/62

(58) Field of Classification Search
USPC .......................................... 330/61 R, 62, 63
See application file for complete search history.

(56) References Cited

U.S. PATENT DOCUMENTS

| | | | |
|---|---|---|---|
| 8,228,703 B2 * | 7/2012 | Javerliac et al. ........... 365/49.17 |
| 2005/0117392 A1 | 6/2005 | Hayakawa et al. |
| 2007/0223270 A1 | 9/2007 | Hung et al. |
| 2007/0259209 A1 | 11/2007 | Slavin et al. |
| 2009/0102465 A1 | 4/2009 | Jansen et al. |
| 2009/0289626 A1 | 11/2009 | Iben |
| 2010/0302832 A1 | 12/2010 | Berger et al. |
| 2011/0002151 A1 | 1/2011 | Javerliac et al. |
| 2013/0241536 A1 * | 9/2013 | Cambou et al. .......... 324/207.14 |

OTHER PUBLICATIONS

International Search Report and Written Opinion issued to international patent application No. PCT/US13/26394, May 6, 2013.

\* cited by examiner

*Primary Examiner* — Steven J Mottola
(74) *Attorney, Agent, or Firm* — Cooley LLP

(57) ABSTRACT

An apparatus includes a circuit and a field line. The circuit includes a magnetic tunnel junction including a storage layer and a sense layer. The field line is configured to generate a magnetic field based on an input signal, where the magnetic tunnel junction is configured such that a magnetization direction of the sense layer and a resistance of the magnetic tunnel junction vary based on the magnetic field. The circuit is configured to amplify the input signal to generate an output signal that varies in response to the resistance of the magnetic tunnel junction.

17 Claims, 11 Drawing Sheets

MAGNETIC LOGIC UNITS CONFIGURED AS AN AMPLIFIER

CROSS-REFERENCE TO RELATED APPLICATION

The present application claims the benefit of U.S. Provisional Application No. 61/600,548, filed on Feb. 17, 2012, the disclosure of which is incorporated herein by reference in its entirety.

FIELD OF THE INVENTION

The invention relates generally to magnetic logic units and, more particularly, to magnetic logic units configured as an amplifier.

BACKGROUND

Traditional active devices used in power amplifiers are typically based on bipolar transistors, metal oxide semiconductor (MOS) field effect transistors, GaAs heterojunction bipolar transistors (HBT), and/or GaN transistors connected together to form a structure large enough to handle desired output power levels. Matching passive component circuits may be used to extract the AC power out for high frequency applications.

These conventional amplifiers may have significant coupling capacitance between the input and the output, such as due to the Miller effect. This capacitance may limit switching speed and bandwidth of these amplifiers. In addition, the power added efficiency of these amplifiers may be limited by transistor characteristics. Moreover, these amplifiers may be fabricated using complementary MOS (CMOS) processes with upwards of twelve layers, which adds to both cost and size of these amplifiers.

It is against this background that a need arose to develop the magnetic logic units configured as an amplifier and related methods described herein.

SUMMARY OF THE INVENTION

One aspect of the invention relates to an apparatus including a circuit and a field line. The circuit includes a magnetic tunnel junction including a storage layer and a sense layer. The field line is configured to generate a magnetic field based on an input signal, where the magnetic tunnel junction is configured such that a magnetization direction of the sense layer and a resistance of the magnetic tunnel junction vary based on the magnetic field. The circuit is configured to amplify the input signal to generate an output signal that varies in response to the resistance of the magnetic tunnel junction.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining Adjacent objects can be spaced apart from one another or can be in actual or direct contact with one another. In some instances, adjacent objects can be formed integrally with one another.

As used herein, the terms "connect," "connected," and "connection" refer to an operational coupling or linking Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

DETAILED DESCRIPTION OF EMBODIMENTS OF THE INVENTION

Figure 1:
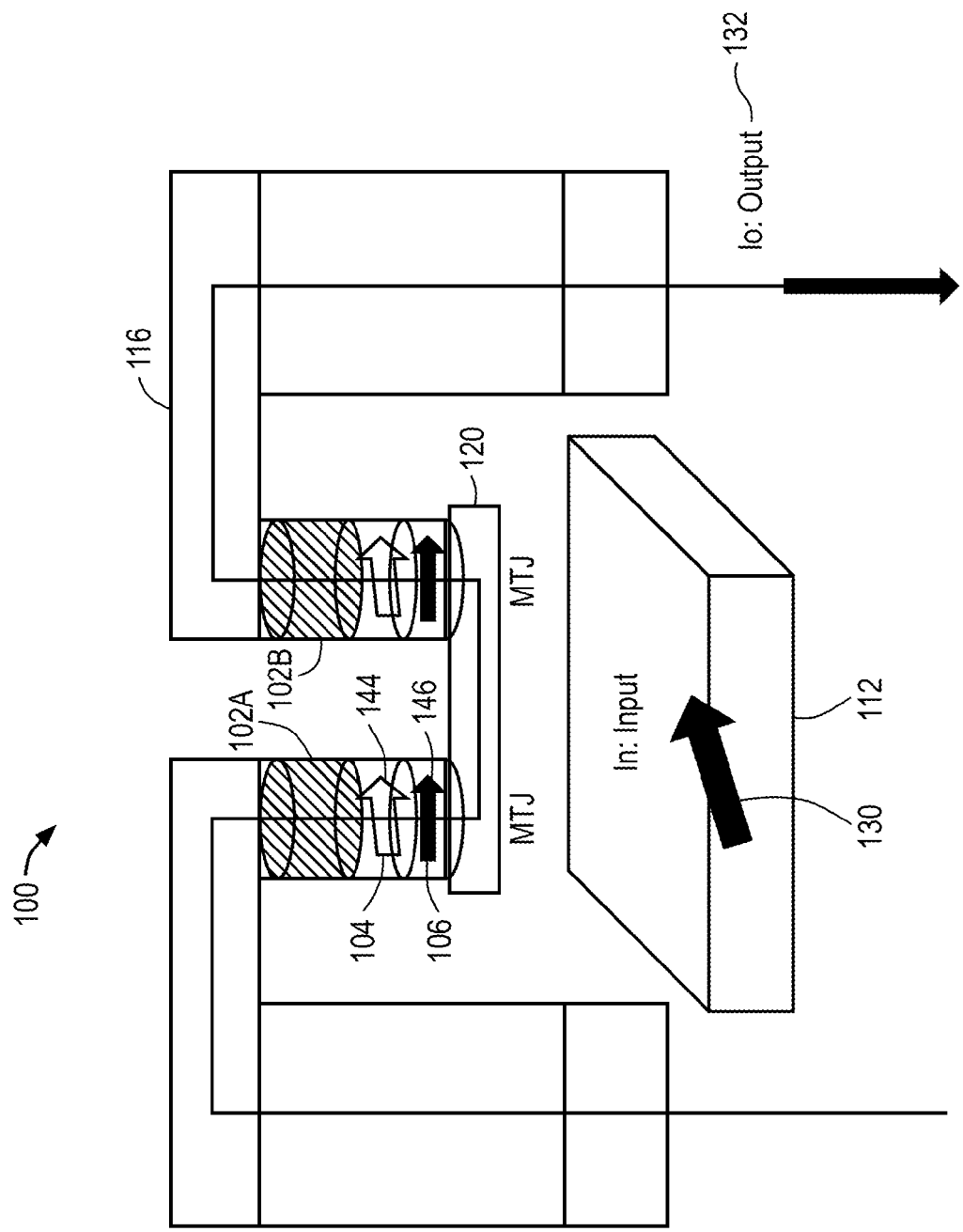
FIG. 1 illustrates a perspective view of a magnetic logic unit (MLU) amplification module, according to an embodiment of the invention.
Figure 2:
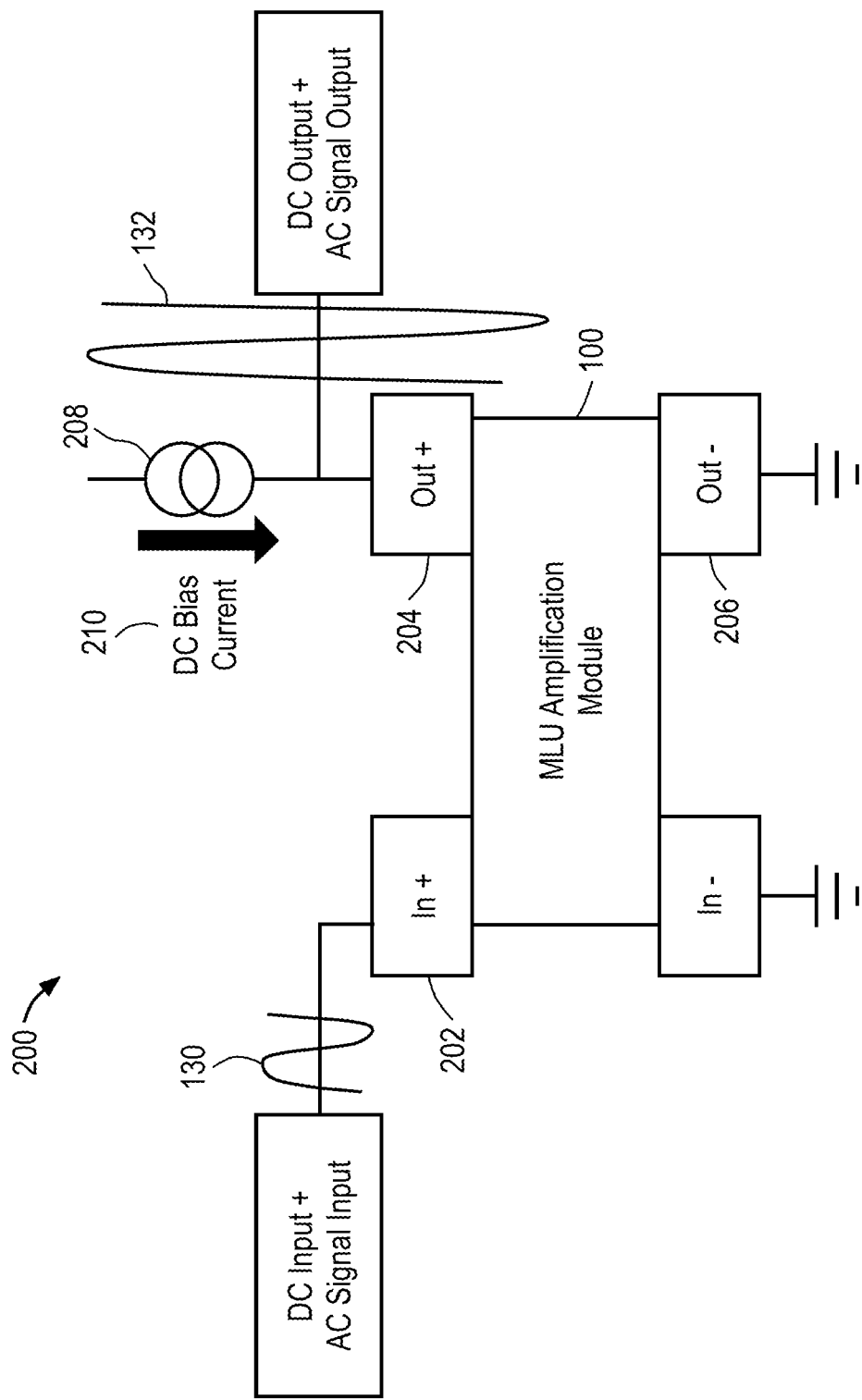
FIG. 2 illustrates a logical block diagram of an MLU-based amplifier including the MLU amplification module, according to an embodiment of the invention.
Figure 3:
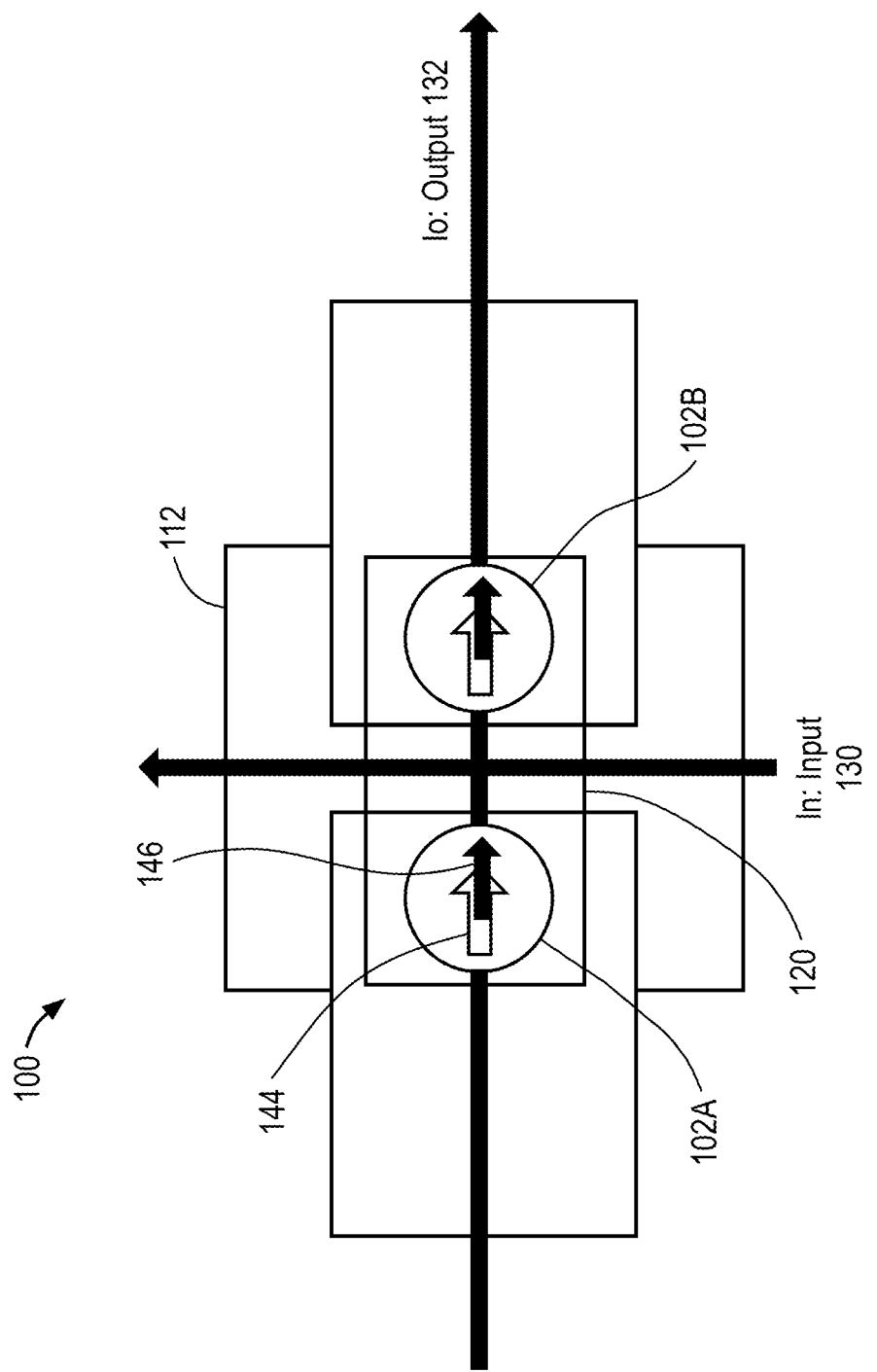
FIG. 3 illustrates a top view of the magnetic logic unit (MLU) amplification module corresponding to the perspective view of FIG. 1, according to an embodiment of the invention.

FIG. 1 illustrates a perspective view of a magnetic logic unit (MLU) amplification module 100, according to an embodiment of the invention. FIG. 2 illustrates a logical block diagram of an MLU-based amplifier 200 including the MLU amplification module 100, according to an embodiment of the invention. FIG. 3 illustrates a top view of the magnetic logic unit (MLU) amplification module 100 corresponding to the perspective view of FIG. 1, according to an embodiment of the invention. Referring to FIGS. 1 through 3, the MLU amplification module 100 may include one or more MLU's 102. In the embodiment of FIG. 1, MLU's 102A and 102B are shown connected by a conductive strap 120. MLU's may be implemented as magnetic tunnel junctions (MTJ's). An input signal 130 may be applied to the MLU-based amplifier 200 through a field line 112 that controls a first terminal 202 that modulates a resistance of each of the MLU's 102, and also a combined resistance of the MLU amplification module 100. For example, the input signal 130 may be an input current that flows through the field line 112, where the input current generates a magnetic field that couples to each of the MLU's 102 to modulate the resistance of each of the MLU's 102. An amplified output signal 132 of the MLU-based amplifier 200 may flow through output line 116, and may be measured across output terminals 204 and 206. The MLU-based amplifier may include bias circuitry that supplies DC power, and that facilitates setting an operating point for the amplifier. The bias circuitry may include circuitry 208 that supplies a DC bias current 210 to facilitate generation of the output signal 132. However, the MLU amplification module 100 itself may not contain any silicon transistors, as none are needed to drive each MLU 102. The MLU amplification module 100 may be solely driven externally through its input and output terminals.

Appendix A is included as part of U.S. Provisional Application No. 61/600,548, and is incorporated by reference herein. Appendix A describes particular embodiments of the MLU-based amplifier 200, and any restrictive or limiting statements in Appendix A applies only to those particular embodiments. As described in Appendix A, an individual MLU 102 implemented as a single MTJ cell may, in one example, have a power gain of about −2 dB. At the same time, the feed forward coupling capacitance between input and output of each MLU 102 is very small. To increase the gain of the MLU-based amplifier 200 while maintaining a very small coupling capacitance, many MLU's 102 may be coupled together. In one embodiment, arrays of magnetic logic units (MLU's) 102 are used to design MLU-based amplifiers of large gains and extended cutoff frequencies.

The MLU 102 can be implemented with one magnetization, namely a storage magnetization 146, that is aligned in a particular stored direction. The MLU 102 can be implemented with another magnetization, namely a sense magnetization 144, that is aligned by a magnetic field generated by the input current corresponding to the input signal 130. This type of MLU 102 is known as self-referenced. Alternatively, the MLU 102 can be implemented with the sense magnetization 144 and a reference magnetization, which is typically a magnetization that may be pre-configured, such as in the factory, but subsequently may have a fixed direction.

Referring to FIGS. 1 and 3, the MLU 102 includes a sense layer 104, a storage layer 106, and a layer 908 (see FIG. 4) that is disposed between the sense layer 104 and the storage layer 106. Other implementations of the MLU 102 are contemplated. For example, the relative positioning of the sense layer 104 and the storage layer 106 can be reversed, with the storage layer 106 disposed above the sense layer 104.

Figure 4:
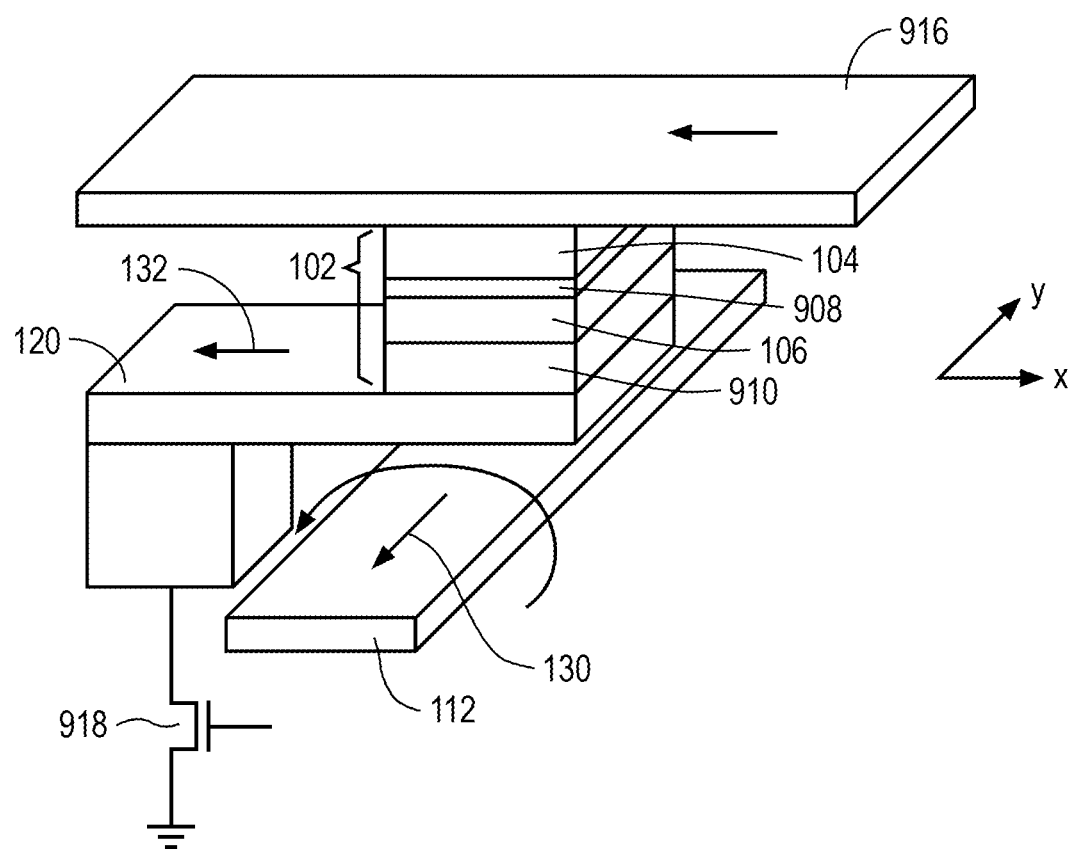
FIG. 4 illustrates a perspective view of the MLU and supporting circuitry that may be included in the MLU amplification module, according to an embodiment of the invention.

FIG. 4 illustrates a perspective view of the MLU 102 and supporting circuitry that may be included in the MLU amplification module 100, according to an embodiment of the invention. Referring to FIGS. 1 and 4, each of the sense layer 104 and the storage layer 106 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 104 and the storage layer 106 can include the same ferromagnetic material or different ferromagnetic materials. As illustrated in FIG. 1, the sense layer 104 can include a soft ferromagnetic material, namely one having a relatively low coercivity, while the storage layer 106 can include a hard ferromagnetic material, namely one having a relatively high coercivity. In such manner, a magnetization of the sense layer 104 can be readily varied under low-intensity magnetic fields generated in response to the input signal 130, while a magnetization of the storage layer 106 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 104 and the storage layer 106 can be in the nm range, such as from about 1 nm to about 20 nm or from about 1 nm to about 10 nm. Other implementations of the sense layer 104 and the storage layer 106 are contemplated. For example, either, or both, of the sense layer 104 and the storage layer 106 can include multiple sub-layers in a fashion similar to that of the so-called synthetic antiferromagnetic layer.

In another embodiment, the MLU 102 may include the storage layer 106 and a reference layer instead of the sense layer 104, with the layer 908 disposed between the storage layer 106 and the reference layer. Each of the reference layer and the storage layer 106 includes, or is formed of, a magnetic material and, in particular, a magnetic material of the ferromagnetic type, the characteristics of which are described previously with reference to FIG. 1. In general, the reference layer and the storage layer 106 can include the same ferromagnetic material or different ferromagnetic materials. The reference layer is different from the sense layer 104 in that the reference layer typically has a high coercivity, such as a coercivity higher than the storage layer 106.

The layer 908 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the layer 908 can be in the nm range, such as from about 1 nm to about 10 nm.

Referring to FIGS. 1 and 4, the MLU 102 also includes the pinning layer 910, which is disposed adjacent to the storage layer 106 and, through exchange bias, stabilizes the storage magnetization along a particular one of the pair of directions when a temperature within, or in the vicinity of, the pinning layer 910 is lower than a temperature $T_{BS}$. The temperature $T_{BS}$ can correspond to a blocking temperature, a Neel temperature, or another threshold temperature. The pinning layer 910 unpins, or decouples, the storage magnetization direction when the temperature is at, or above, the blocking temperature $T_{BS}$, thereby allowing the storage magnetization direction to be switched to another one of the pair of directions.

In one embodiment, such a pinning layer is omitted adjacent to the sense layer 104, and, as a result, the sense layer 104 has a sense magnetization direction that is unpinned and is readily varied, with the substantial absence of exchange bias.

In another embodiment, as previously described, the MLU 102 includes a reference layer instead of the storage layer 106. In this embodiment, an additional pinning layer may be disposed adjacent to the reference layer. This additional pinning layer may be characterized by a threshold temperature $T_{BR}$, with $T_{BR} > T_{BS}$. The temperature $T_{BR}$ can correspond to a blocking temperature, a Neel temperature, or another threshold temperature. Through exchange bias, this additional pinning layer stabilizes the reference magnetization along a substantially fixed direction at temperatures lower than the threshold temperature $T_{BR}$.

The pinning layer 910 (and the additional pinning layer disposed adjacent to the reference layer in the alternative embodiment) includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., such as about 200° C., and can be smaller than the blocking temperature $T_{BS}$ of alloys based on Pt and Mn (or based on Ni and Mn), which can be in the range of about 300° C. to about 350° C.

Figure 5:
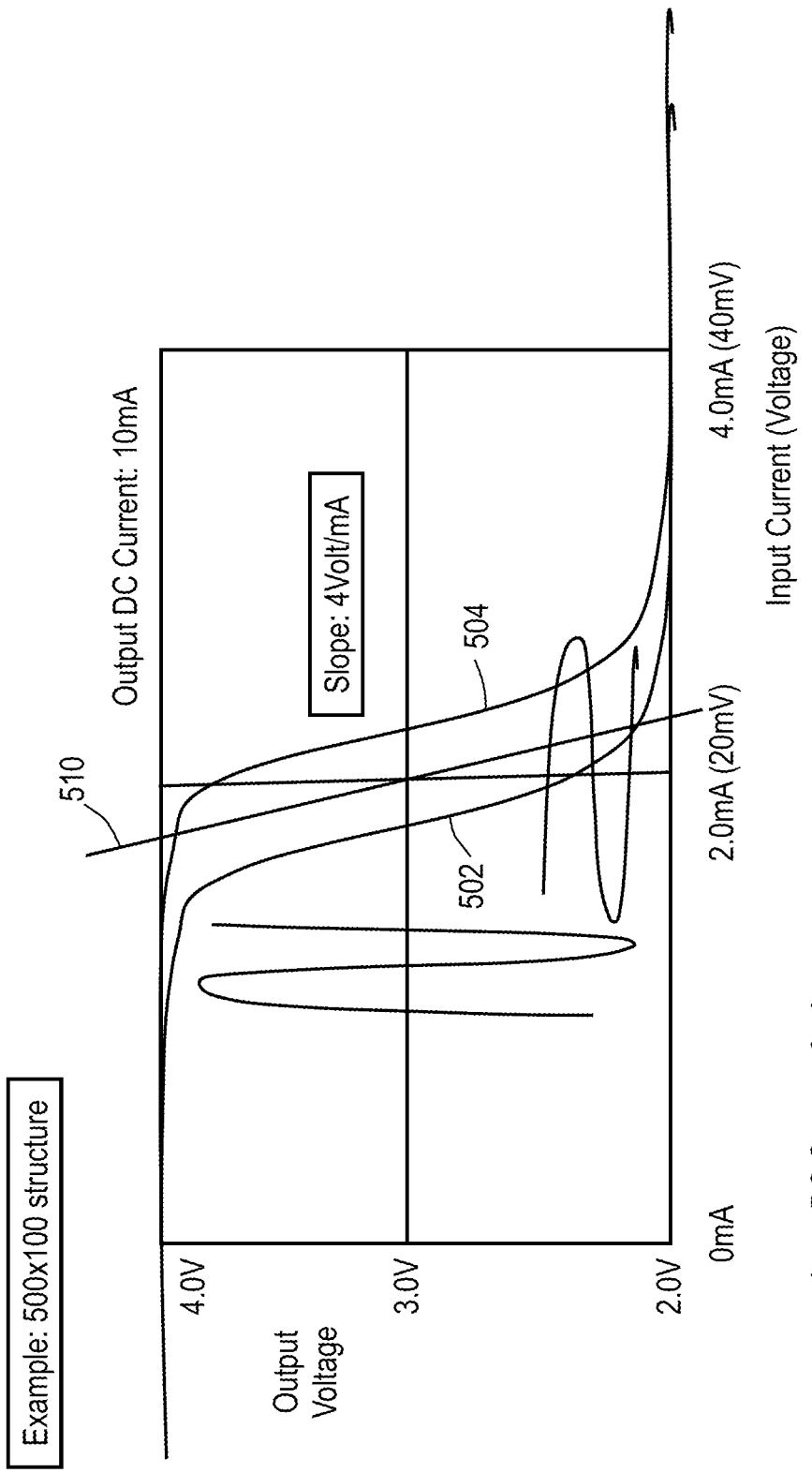
FIG. 5 illustrates an example of a response curve relating an output signal of the MLU-based amplifier to an input signal to the MLU-based amplifier, according to an embodiment of the invention.

Referring to FIGS. 1, 2, and 4, thermally assisted switching (TAS) technology, as applied to MLU's 102, provides one way of implementing a device with a resistance that varies in response to the input signal 130 for use in amplifiers, as explained herein. FIG. 5 illustrates an example of a response curve relating the output signal 132 of the MLU-based amplifier 200 to the input signal 130, according to an embodiment of the invention. In the example of FIG. 5, the MLU amplification module 100 includes an array of MLU's 102 with 500 parallel rows of MLU's 102, each row having 100 MLU's 102 in series (see, for example, FIG. 7 with Np equal to 500 and Ns equal to 100), and the output signal 132 of the MLU-based amplifier 200 is measured across the MLU amplification module 100. In one embodiment, the input signal 130 to the MLU amplification module 100 may flow through one or more field lines 112 such that a magnetic field generated by the input signal 130 is coupled to each of the MLU's 102. In one embodiment, the field line 112 may be positioned about 50 nm underneath the strap 120. When the input signal 130 is zero (e.g., zero input current), the sense magnetization 144 and the storage magnetization 146 of the MLU 102 are naturally substantially anti-aligned (e.g., substantially antiparallel), resulting in a series resistance of 2 KΩ per MLU 102 included in the MLU amplification module 100. When the input signal 130 is sufficiently small (e.g., less than a value in the range from about 1.5 mA to about 1.75 mA in the example shown in FIG. 5), the sense magnetization 144 and the storage magnetization 146 of the MLU 102 remain substantially anti-parallel, resulting in a series resistance of about 2 KΩ per MLU 102. When the input signal 130 is sufficiently large (greater than a value in the range from about 2.25 mA to about 2.5 mA in the example shown in FIG. 5), the sense magnetization 144 becomes substantially aligned (e.g., substantially parallel) with the storage magnetization 146, resulting in a series resistance of about 1 KΩ per MLU 102. It is contemplated that these resistance values, and in particular the ratio between these resistance values, may be varied for other embodiments of the MLU 102 based on forming the sense layer 104, the storage layer 106, and/or the layer 108 from different choices of materials, material concentrations, and/or material thicknesses.

In the example of FIG. 5, and also referring to FIG. 2, the input signal 130 includes 2 mA DC current along with the AC input signal. The variations in the input signal 130 due to the AC input signal result in variations in the resistances of each MLU 102 magnetically connected to the field line 112, and therefore in a variation of the combined resistance of the MLU's 102 included in the MLU amplification module 100. The DC bias current 210 flows through the MLU amplification module 100, generating an output voltage based on the variation of the combined resistance of the MLU's 102 included in the MLU amplification module 100. The output signal 132 may be this output voltage signal, or alternatively may be an output current signal generated based on this output voltage signal. The response curve relating the output signal 132 of the MLU-based amplifier 200 to the input signal 130 has a substantially linear region 510 around 2 mA input current that has a slope of about 4 Volts/mA. When an AC input signal is applied with a peak to peak amplitude of 0.5 mA, the AC output signal has a peak to peak output amplitude of 2.0 Volts.

The substantially linear region 510 may be formed as an average of the input-output response curves of multiple MLU's 102. In the example of FIG. 5, each MLU 102 switches over a different input current range. For example, MLU's 102 may switch over input currents in the range from about 1.5 mA to about 2.25 mA on the lower end 502, and in the range from about 1.75 mA to about 2.5 mA on the higher end 504 as shown in FIG. 5. To stay in the linear region of the IV response curve, the output voltage swing resulting from this input current swing may be about 80% of the full output voltage range. It is contemplated that these input current ranges may be varied across embodiments of the MLU 102 based on forming the sense layer 104, the storage layer 106, and/or the layer 108 from different choices of materials, material concentrations, and/or material thicknesses. For example, these input current ranges may typically vary from those shown in FIG. 5 to an input current range around a DC current of about 5 mA.

There are multiple ways to set up the MLU-based amplifier 200, such as linear, saturated, and class C. For linear amplification, such as for class A amplification, the input DC current can be adjusted to an operating point (bias point) where slope of the response curve is the highest (e.g., where a gain of the MLU-based amplifier 200 is substantially maximized). In the example of FIG. 5, this operating point is at about 2 mA input current. For maximum power efficiency, such as for class C amplification, the input DC current can be adjusted to an operating point where the DC power associated with the DC bias current 210 in the output stage of the MLU-based amplifier 200 is at its minimum, where the operating point remains within the substantially linear region 510. In the example of FIG. 5, this operating point is at about 2.25 mA input current. It is contemplated that averaging of the input-output response curves of many MLU's 102 (such as thousands of MLU's 102 in the example of FIG. 5) in an MLU-based amplifier 200 may result in increased linearity of the substantially linear region 510 of the MLU-based amplifier 200 as compared to the input-output response curve of a single MLU 102. It is also contemplated that averaging of the input-output response curves of many MLU's 102 in each MLU-based amplifier 200 may result in greater uniformity and predictability of the class A and class C operating points across the MLU-based amplifiers 200.

Referring to FIGS. 1 and 2, the output current per MLU 102 should be low enough to avoid heating the MLUs 102 close to the blocking temperature of the storage layer 106 (or in other embodiments, the reference layer). In the example of FIG. 5, the output current per MLU 102 is set at a conservative 20 µA to prevent the stored magnetizations from switching during amplification. A programming current (described further below) that sets the storage magnetization 146 (or in other embodiments, the reference magnetization) is anticipated to be approximately 0.2 mA per MLU 102, which is many times larger than the 20 µA setting during amplification. In the example of FIG. 5 (with Np=500 parallel rows of MLU's 102, each row having Ns=100 MLU's 102 in series), the total DC output current to maintain 20 µA per MLU 102 is (Np×20 µA), or 10 mA. When the DC bias current 210 is configured to be a constant 10 mA applied through the output, the voltage drop is about 2.0 Volts when all of the MLU's 102 are substantially aligned, and swings to about 4.0 Volts when all of the MLU's 102 are substantially anti-aligned.

Referring to FIGS. 2 and 5, the output power delivered to a load by the MLU-based amplifier 200 depends on the operating point, and impedance matching between the output of the MLU-based amplifier 200 and the load. We now determine a relationship between the output power of the MLU-based amplifier 200 and the output power of an individual MLU 102. The output power of the MLU-based amplifier 200 is:

$$Pout = \Delta(Vout) \times Iout/2 \quad (1)$$

In this example, the MLU-based amplifier 200 has Np parallel rows of MLU's 102, each row having Ns MLU's 102 in series. The voltage drop across the MLU-based amplifier 200 is then:

$$\Delta Vout = Ns \times Rmtj \times I_s \quad (2)$$

where Rmtj is the resistance of each MLU 102 with both domains substantially aligned. In this example Rmtj has a value of approximately 1 kOhm. $I_s$ is the current circulating in each row of Ns MLUs 102 in series. Then the total current circulating through the MLU-based amplifier 200 is:

$$Iout = I_s \times Np \quad (3)$$

The maximum output power delivered by the MLU-based amplifier 200 is:

$$Pout = Ns \times Np \times Rmtj \times I_s^2/2 \quad (4)$$

The right side of this equation can be rewritten in terms of Pmtj, the output power delivered by a single MLU 102:

$$Pout = N \times Pmtj \quad (5)$$

where N is the total number of MLU's 102 in the MLU-based amplifier 200. This analysis indicates that the architecture of the MLU-based amplifier 200 may be highly scalable, as the higher the number of interconnected MLU's 102, the higher the output power of the MLU-based amplifier 200 may be. This analysis also indicates that the output power of the MLU-based amplifier may not be dependent on whether the MLU's 102 are connected in series or in parallel. For example, an MLU-based amplifier 102 including 50,000 MLU's 102 has a Pout of 10 mW for various possible example configurations:

Configuration 1: Np=2,500, Ns=20: ΔVout=0.4V Iout=50 mA Pout=10 mW

Configuration 2: Np=1,000, Ns=50: ΔVout=1.0V Iout=20 mA Pout=10 mW

Configuration 3: Np=500, Ns=100: ΔVout=2.0V Iout=10 mA Pout=10 mW

For configuration 3, if the AC signal at the input stage has a peak current of 0.25 mA and a voltage of 2 mV, the value of Pin, the power in, is 0.5 µW. The Pout in the linear range may be at least 5 mW, so the resulting gain in power may be 5,000.

As can be seen from the above example, and referring to FIG. 2, the DC bias current 210 and the peak-to-peak voltage of the output signal 132 for a given maximum output power of the MLU-based amplifier 200 are dependent on the number of parallel rows of MLU's 102, and the number of MLU's 102 in series in each row. The DC bias current 210 and the peak-to-peak voltage of the output signal 132 for a given maximum output power of the MLU-based amplifier 200 are therefore dependent on the combined resistance of the MLU's 102 included in the MLU-based amplifier 200.

Referring to FIGS. 1 and 4, the storage layer 106 may be configured through a configuration operation. This configuration operation may occur during processing by the MLU-based amplifier 200. In one embodiment, during a programming cycle, a relatively small current is applied through the MLU 102 to heat the pinning layer 910 by Ohmic effect. When a temperature of the pinning layer 910 is above a threshold temperature, the direction of the storage magnetization 146 is unpinned, thereby allowing the storage magnetization 146 to be programmed by applying a current through the field line 112 that is magnetically connected to the cell. The storage magnetization 146 can be configured in a first direction by applying the current in one particular direction, and can be configured in a second direction opposite to the first direction by applying the current in an opposite direction. After programming, the MLU 102 is cooled below the threshold temperature, thereby pinning the storage magnetization 146 in the programmed direction. In another embodiment (in which the MLU 102 may include a reference layer instead of the storage layer 106), a magnetization of the reference layer may be pre-configured, such as in the factory. Alternatively, in one embodiment, the storage magnetization 146 may be pre-configured, such as in the factory, by at least one of a field line external to the MLU-based amplifier 200 and an external heating mechanism. In another embodiment, the storage magnetization 146 may be pre-configured, such as in the factory, by at least one of the field line 112 (internal to the MLU-based amplifier 200) and an internal heating mechanism, such as a bit line (described below).

Still referring to FIGS. 1 and 4, the MLU amplification module 100 may also include a set of traces (or strip conductors) to provide programming functions. Specifically, a bit line 916 is electrically connected to the MLU 102 on the side of the sense layer 104 (or, in an alternative embodiment, the reference layer) and is substantially orthogonal to the field line 112, which is disposed below and magnetically connected to the MLU 102 on the side of the storage layer 106. The bit line 916 may include at least part of the output line 116 of FIG. 1, or may correspond to the output line 116 of FIG. 1. The MLU amplification module 100 may further include a transistor 918, which is electrically connected, through the strap 120, to the MLU 102 on the side of the storage layer 106. The transistor 918 is switchable between a blocked mode (OFF) and a conducting mode (ON), thereby allowing the flow of a current through the MLU 102. Other implementations of the MLU amplification module 100 are contemplated. For example, the relative orientation of the bit line 916 and the field line 112 can be varied from that illustrated in FIG. 4. As another example, the relative positioning of the bit line 916 and the field line 112 can be reversed, with the field line 112 disposed above the bit line 916.

Referring to FIG. 4, during a TAS-type programming cycle, the MLU 102 is heated by applying a heating current through the MLU 102 via the bit line 916, with the transistor 918 in a conducting mode. The MLU 102 is heated to a temperature above the blocking or threshold temperature $T_{BS}$ of the pinning layer 910, such that a magnetization of the storage layer 106 is unpinned. (In the alternative embodiment, the MLU 102 is heated to a temperature above the blocking or threshold temperature $T_{BS}$ of the pinning layer 910 but below the blocking or threshold temperature $T_{BR}$ of the additional pinning layer, such that a magnetization of the storage layer 106 is unpinned but the magnetization of the reference layer remains fixed.) Simultaneously or after a short time delay, the field line 112 is activated to induce a write magnetic field to switch the storage magnetization from an initial direction to another direction. Specifically, a write current is applied through the field line 112 to induce the write magnetic field to switch the storage magnetization direction, according to the direction of the write current. Because the storage magnetization direction can be aligned according to the write magnetic field, the storage magnetization direction can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

Once the storage magnetization is switched to a programmed direction, the transistor 918 is switched to a blocked mode to inhibit current flow through the MLU 102, thereby cooling the MLU 102. The write magnetic field can be maintained during cooling of the MLU 102, and can be deactivated once the MLU 102 has cooled below the blocking temperature $T_{BS}$ of the pinning layer 910. Because the storage magnetization direction is pinned by the exchange bias of the pinning layer 910, its orientation remains stable so as to retain the stored magnetization direction.

Other implementations of programming cycles are contemplated. For example, the MLU 102 can be implemented with an anisotropic shape having a relatively high aspect ratio, such as about 1.5 or more. In such an anisotropic-shaped implementation of the MLU 102, the storage magnetization direction can be switched and can remain stable, without requiring the pinning layer 910. As another example, a programming cycle can be carried out by applying a write current through the MLU 102 via the bit line 916, using the so-called spin transfer torque ("STT") effect. In such a STT-type programming cycle, the write current can become spin polarized by passing through a polarizing magnetic layer (not illustrated) or through the sense layer 104, and a magnetization of the storage layer 106 can be switched according to a spin-polarized orientation of the write current. Switching of the storage layer magnetization with the spin-polarized write current also can be combined with a TAS-type programming cycle, such as by heating the MLU 102 above the blocking temperature $T_{BS}$ and then applying the spin-polarized write current through the MLU 102.

Figure 6:
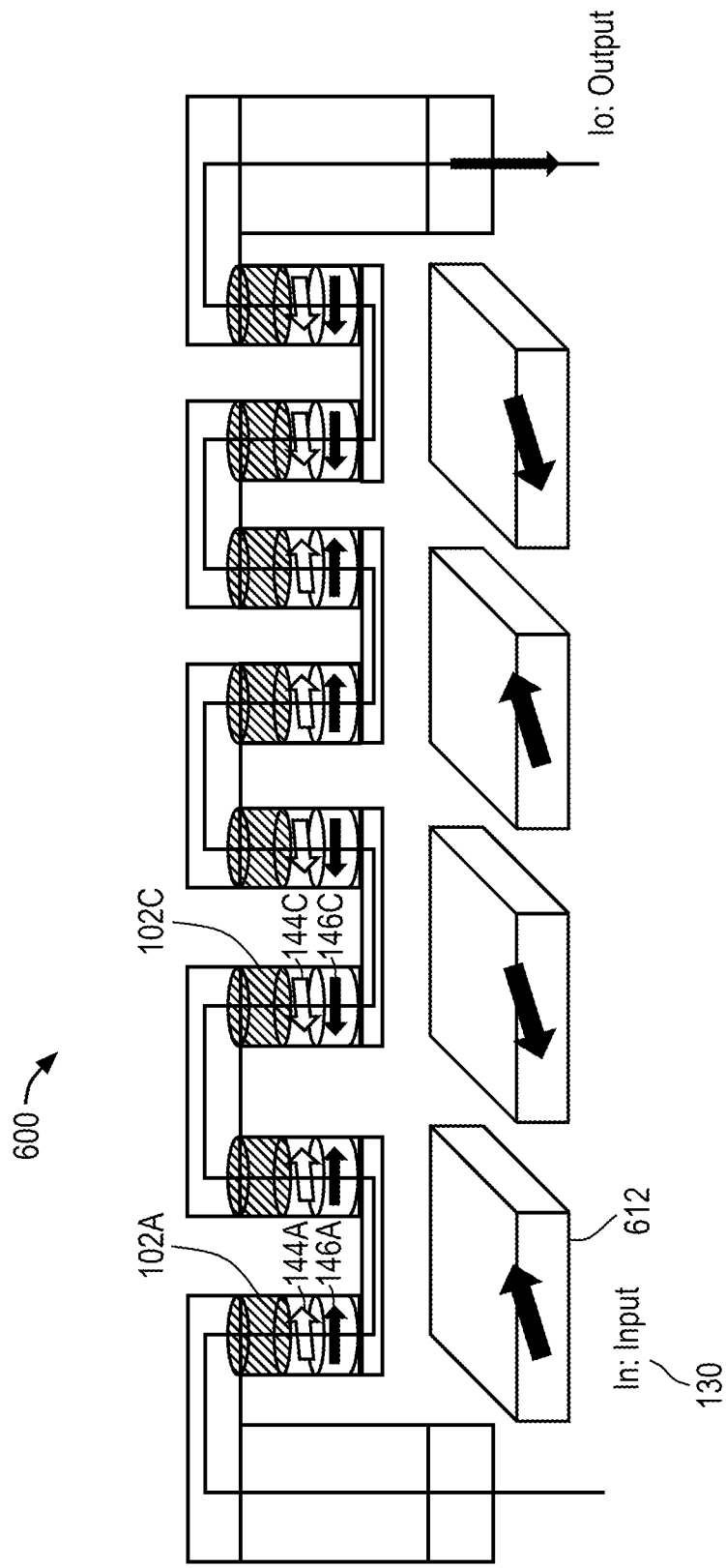
FIG. 6 illustrates a perspective view of an MLU amplification module, according to an embodiment of the invention.

FIG. 6 illustrates a perspective view of an MLU amplification module 600, according to an embodiment of the invention. The MLU amplification module 600 is in many respects similar to the MLU amplification module 100 already described with reference to FIG. 1. As described with reference to FIGS. 5 and 7, the MLU's 102 included in the MLU amplification module 600 may be arranged in an array with Np parallel rows of MLU's 102, each row having Ns MLU's 102 in series. This array may be compact. For example, 50,000 MLU's 102 may fit in a footprint with an area in the range from about 0.1 to about 0.5 square millimeters.

In one embodiment, the array of MLU's 102 included in the MLU amplification module 600 may be magnetically connected to a single field line 612. The field line 612 may be curved and/or serpentine (shown in FIG. 7). In this embodiment, the input current 130 flowing through the field line 612 flows in a first direction relative to the MLU 102A and in a second direction substantially opposite to the first direction relative to the MLU 102C. As a result, a direction (shown in FIG. 6) of the sense magnetization 144A and the storage magnetization 146A of the MLU 102A resulting from the input current 130 is substantially opposite to a direction (shown in FIG. 6) of the sense magnetization 144C and the storage magnetization 146C of the MLU 102C resulting from the input current 130.

For self-referenced MLU's 102, the configuration of the storage magnetization 146 of each of the MLU's 102 by the field line 612 allows the direction of the input current 130 flowing through the field line 612 to switch from a first direction to a second direction substantially opposite to the first direction. For example, prior to operating the MLU amplification module 600 with the input current 130 flowing in the first direction, the storage magnetizations 146 of the MLU's 102 may be configured with the input current 130 flowing in the first direction (described with reference to FIG. 4), and therefore based on the shape of the field line 612. Prior to operating the MLU amplification module 600 with the input current 130 switched to the second direction, the storage magnetizations 146 of the MLU's 102 may be configured with the input current 130 flowing in the second direction (described with reference to FIG. 4), and again based on the shape of the field line 612. In this way, in one embodiment, both directions of input current flow through a serpentine field line may be leveraged.

Alternatively, for MLU's 102 in which a reference magnetization is pre-configured (such as in the factory), the pre-configuration may be performed such that the direction of the reference magnetization corresponds to the first direction of input current flow through the field line 612, and is therefore based on the shape of the field line 612. In this embodiment, because the direction of the reference magnetization is not subsequently changed, the MLU amplification module operates with the input current 130 flowing in the first direction, but not with the input current 130 flowing in the second direction.

Figure 7:
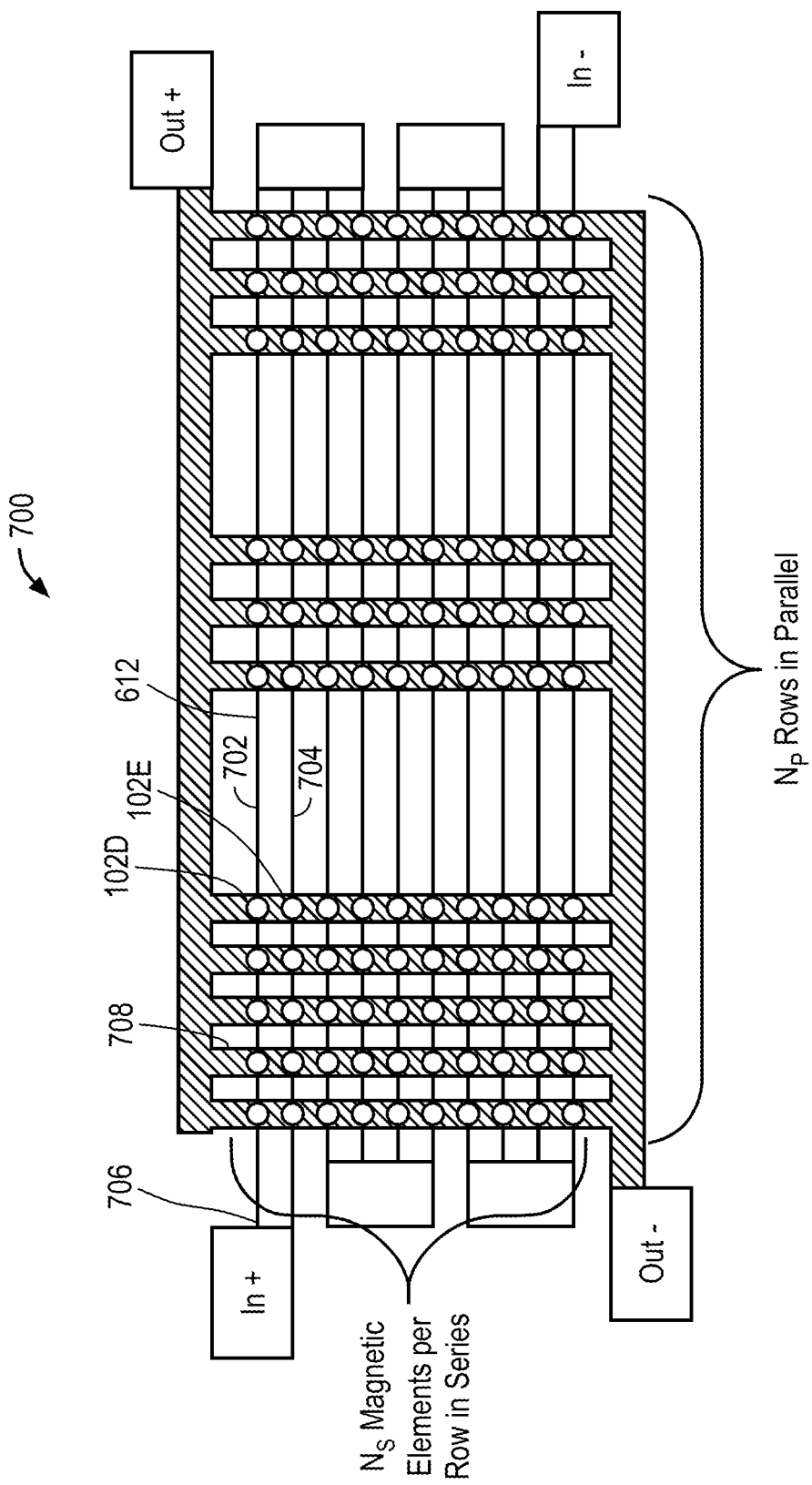
FIG. 7 illustrates a perspective view of an MLU amplification module, according to an embodiment of the invention.

FIG. 7 illustrates a perspective view of an MLU amplification module 700, according to an embodiment of the invention. The MLU amplification module 700 is in many respects similar to the MLU amplification module 600 already described with reference to FIG. 6, so differences are discussed here. In this embodiment, the field line 612 has a first lateral edge 702, a second lateral edge 704 opposite to the first lateral edge 702, and a first end 706. The MLU's 102 are divided into groups, where at least a portion of each of the MLU's 102 in each group is disposed between the first lateral edge 702 and the second lateral edge 704, and where each of the MLU's 102 in each group is disposed substantially the same distance (lengthwise along the field line 612) from the first end 706. In the embodiment of FIG. 7, there are two MLU's 102 in each group. For example, MLU's 102D and 102E are in one group. It is contemplated that in other embodiments, there may be more or fewer MLU's 102 in each group. For example, there may be one, three, four, or five MLU's in each group.

It may be advantageous to widen the field line 612 to accommodate the number of MLU's 102 in each group. As described in Appendix A, a wider field line 612 has a lower resistance, which can reduce the input power per MLU 102. In addition, a larger number of MLU's 102 per group can also reduce the input power per MLU 102. However, it should be noted that effectiveness of cladding adjacent to the field line 612 (for focusing the magnetic field generated by the field line 612 so that magnetic coupling to the MLU's 102 is increased) may be reduced for a wider field line 612.

Figure 8:
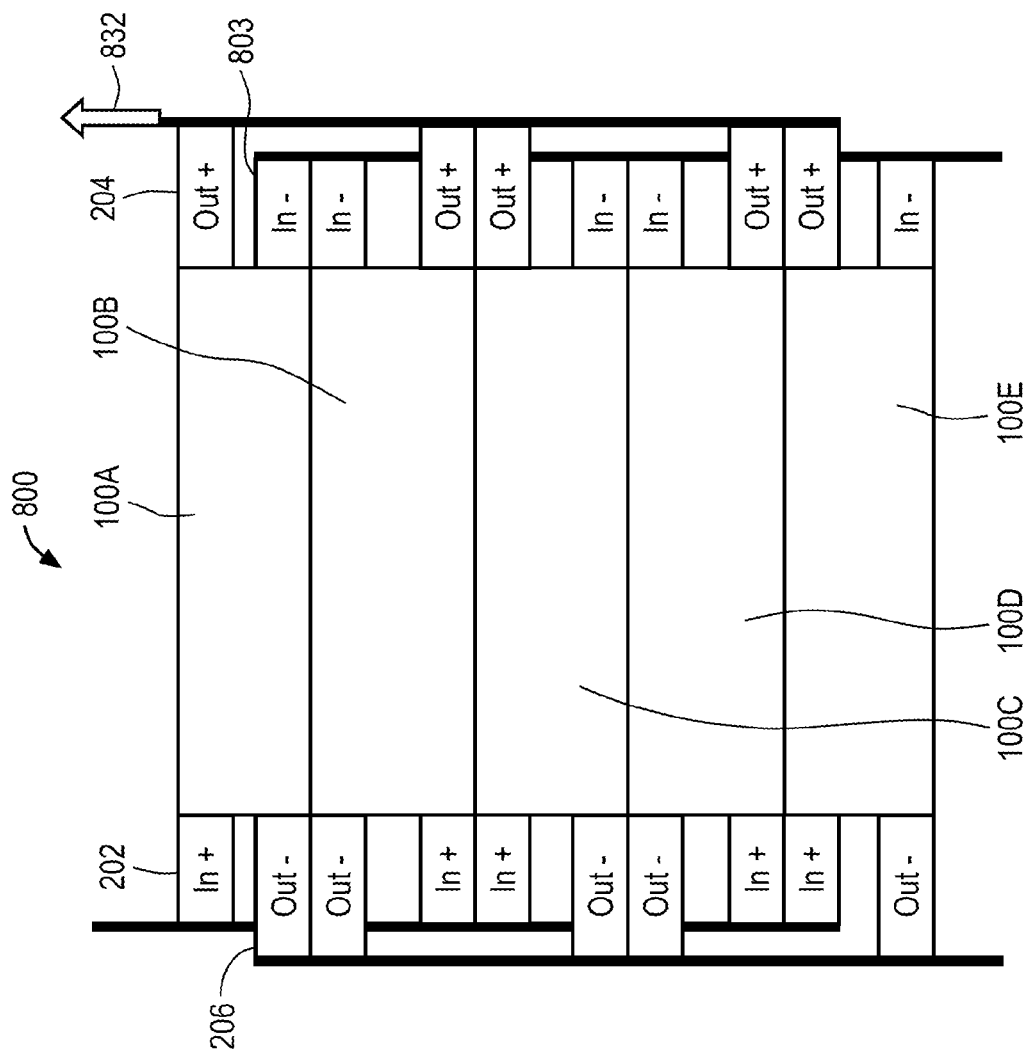
FIG. 8 illustrates a perspective view of multiple MLU amplification modules connected together in a larger array, according to an embodiment of the invention.

FIG. 8 illustrates a perspective view of multiple MLU amplification modules 100 connected together in a larger array 800, according to an embodiment of the invention. The MLU amplification modules 100 (100A-100E in this embodiment) may be disposed laterally adjacent to each other, with input ports 202 connected together, input ports 803 connected together, output ports 204 connected together, and output ports 206 connected together. In this way an output signal 832 with increased output power can be generated, as compared to the output signal 132 (see FIG. 2) of a single MLU amplification module 100. It is contemplated that other embodiments of MLU amplification modules, such as MLU amplification modules 600 and 700, may also be connected together in this manner to obtain an output signal with increased output power.

Figure 9:
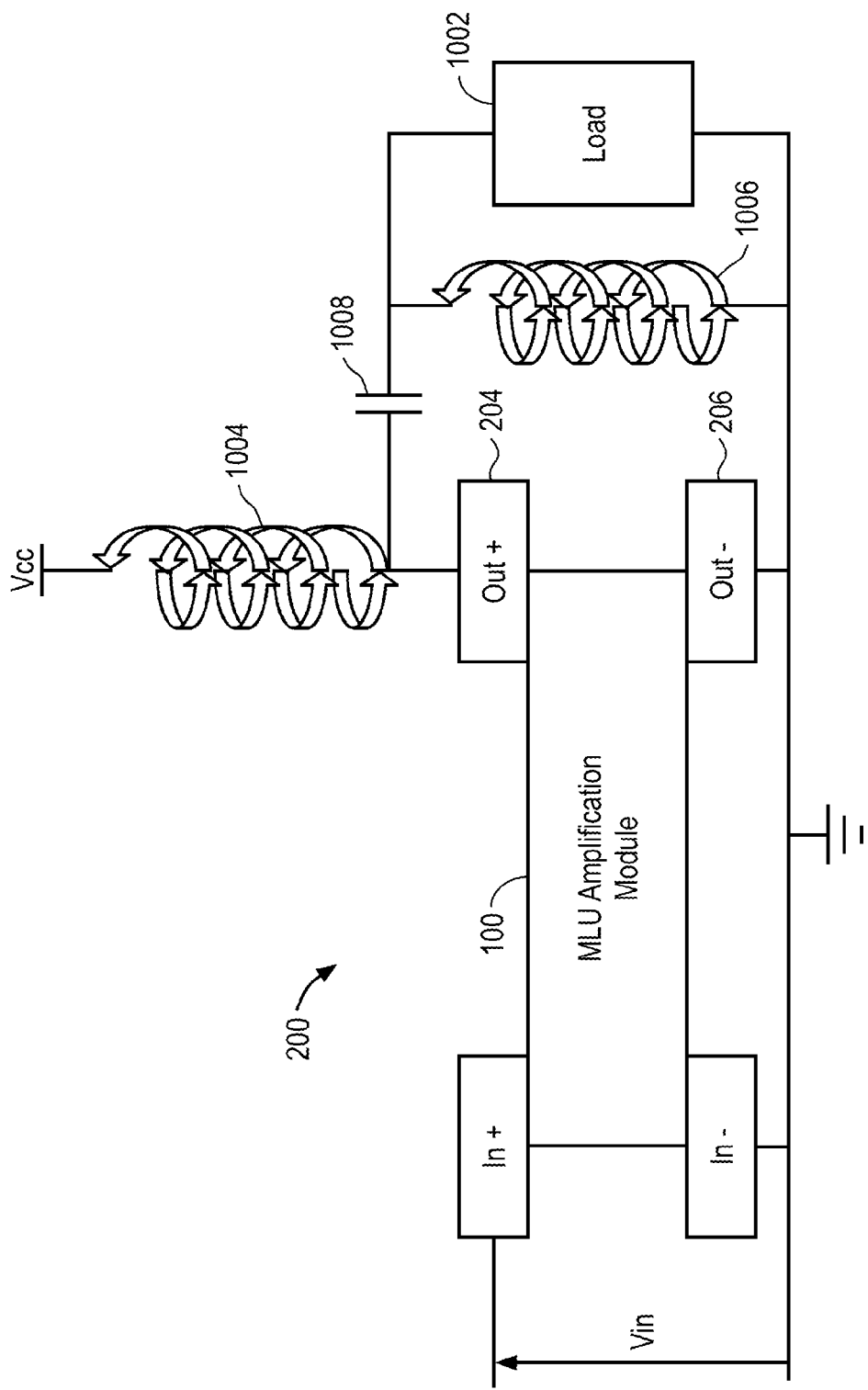
FIG. 9 illustrates a logical block diagram of an MLU-based amplifier that is impedance matched to an output load, according to an embodiment of the invention.

FIG. 9 illustrates a logical block diagram of an MLU-based amplifier 200 that is impedance matched to an output load 1002, according to an embodiment of the invention. The output resistance of the MLU amplification module 100 (across the output terminals 204 and 206) may be set to facilitate impedance matching to the load 1002. Referring to FIG. 7, for example, Ns (the number of MLU's 102 per output row 708 in series) and Np (the number of rows 708 of MLU's 102 in parallel) can be pre-configured (such as during fabrication) for a given total number (Ns×Np) of MLU's 102 to set the output resistance of the MLU amplification module 100. In addition, inductances 1004 and 1006 and capacitance 1008 can be determined and/or set for impedance matching to the load 1002. For example, these components can be pre-configured during fabrication.

In addition, the input resistance of the MLU amplification module 100 may be set to facilitate input impedance matching. For example, a width of the field line 112 (see FIG. 1) may be pre-configured (such as during fabrication) to set the input resistance of the MLU amplification module 100. One of ordinary skill in the art would understand how to determine the input resistance of the MLU amplification module 100 and any inductances and capacitances needed for input impedance matching. One of ordinary skill in the art would also understand how to pre-configure these components (such as during fabrication).

Figure 10:
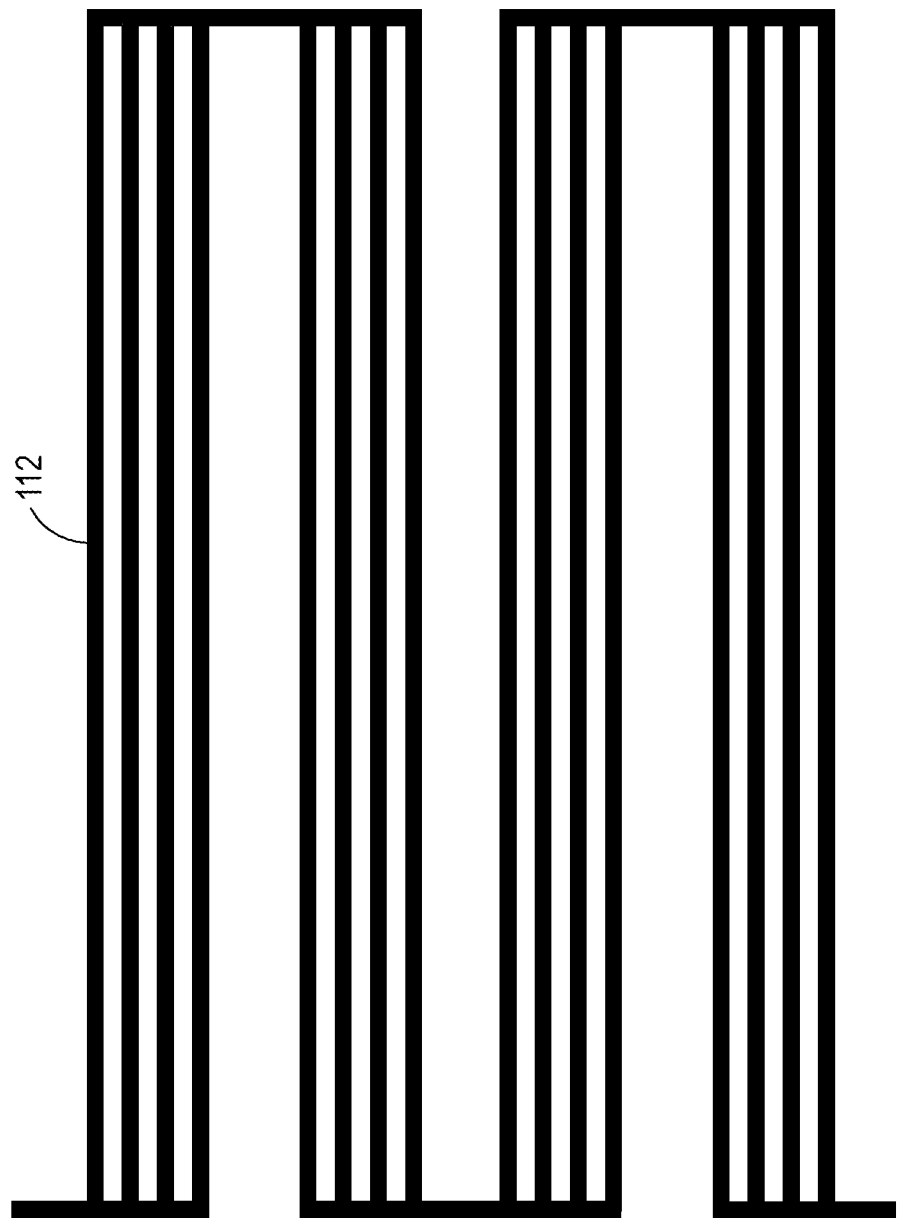
FIG. 10 illustrates multiple field lines in parallel, according to an embodiment of the invention.

FIG. 10 illustrates multiple field lines 112 in parallel, according to an embodiment of the invention. Each of the multiple field lines 112 has an impedance that may include a resistive component (corresponding to a resistance) and a reactive component (corresponding to an inductance and/or a capacitance). As described in Appendix A, it may be advantageous to provide multiple field lines 112 in parallel to reduce the input resistance of the MLU amplification module 100. Multiple field lines 112 in parallel have a lower resistance, which can reduce the input power dissipation per MLU 102. Multiple field lines 112 in parallel may also increase the effectiveness of cladding adjacent to the field line 612 (for focusing the magnetic field generated by the field line 612 so that magnetic coupling to the MLU's 102 is increased) as compared to the wider field line 612 described with reference to FIG. 7.

Figure 11:
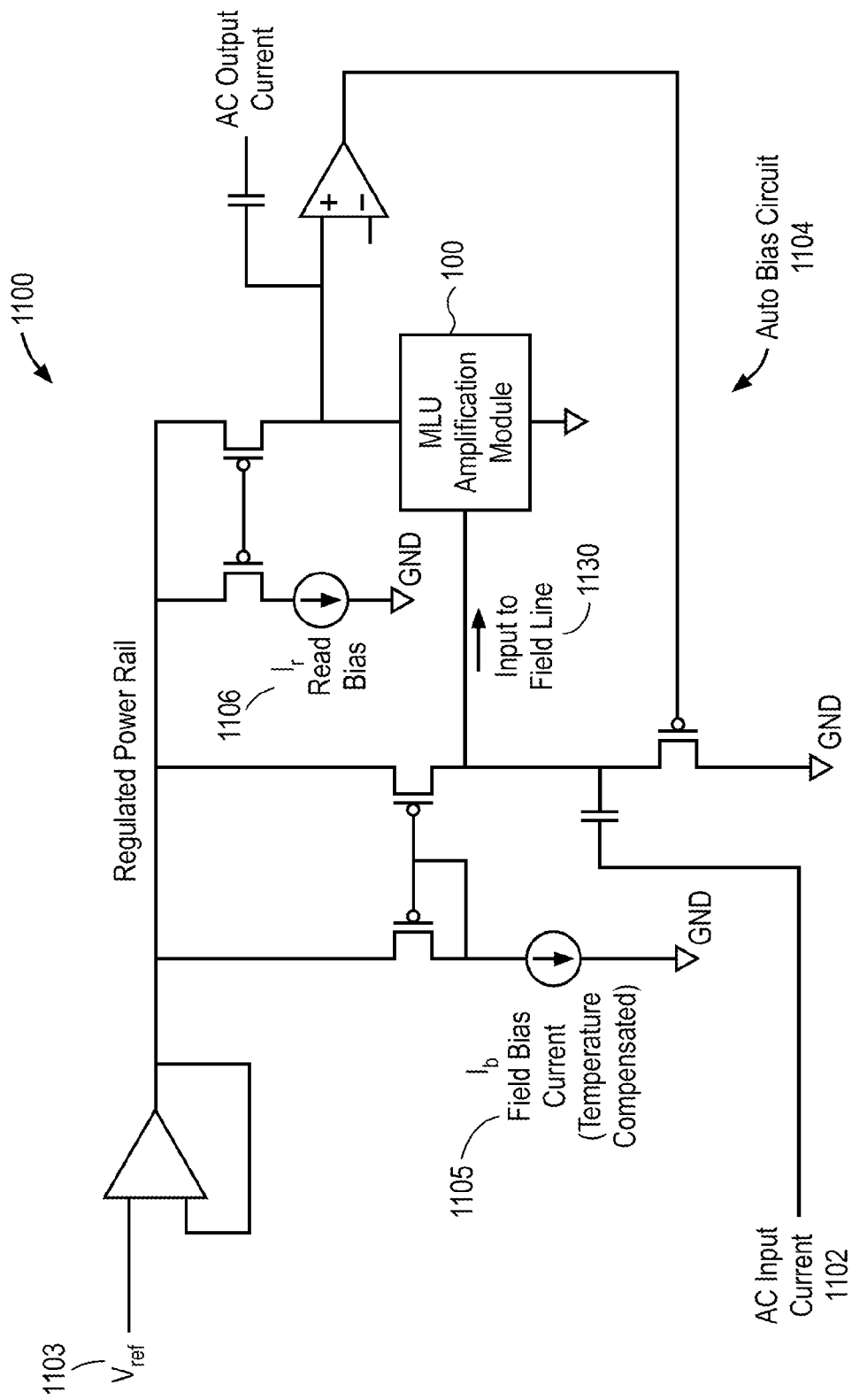
FIG. 11 illustrates an MLU-based amplifier including a feedback circuit configured to control linearity of amplification of an input AC signal, according to an embodiment of the invention.

FIG. 11 illustrates an MLU-based amplifier 1100 including a feedback circuit 1104 configured to control linearity of amplification of an input AC signal 1102, according to an embodiment of the invention. An input signal 1130 to the MLU amplification module 100 is generated based on field bias current 1105 and AC input current 1102. The operating point (see description with reference to FIG. 5) is based on the field bias current 1105, which is temperature compensated in a manner that is understood by one of ordinary skill in the art. A reference voltage 1103 and a read bias current 1106 are provided to the MLU amplification module 100 to set the output voltage and current of the MLU amplification module 100 based on Ns (the number of MLU's 102 per row in series) and Np (the number of rows of MLU's 102 in parallel). Feedback from the output of the MLU amplification module is provided by the feedback circuit 1104 such that the input signal 1130 is varied to control linearity of amplification of an input AC signal 1102, such as by setting the combined resistance of the MLU's 102.

In one embodiment, and with reference to FIGS. 1 and 2, the switching of the storage magnetization 146 and the sense magnetization 144 may be faster than electron transfer mechanisms, which can result in an extended cutoff frequency for the MLU amplifier 200. The switching may occur in the range from about 5 picoseconds to about 20 picoseconds, such as about 10 picoseconds. With such a value, the MLU amplifier 200 may be capable of operating in the 100 GHz range. Unlike traditional semiconductor devices, the Miller effect (or increase in parasitic capacitance resulting from a gain amplified feedback loop of the output to the input) is reduced. Between the field line 112 and the strap 120 under the MLU 102, there is a parasitic capacitance that shunts the device at extremely high frequency. In embodiments of the invention, this capacitance may be reduced by:

Reducing the size of the MLU's 102 and the strap 120 connecting two adjacent MLU's 102;

Using low dielectric constant (K) material for the dielectric located between the MLU's 102 and the field line 112; and Using separated field lines 112 to reduce overlap area between the strap 120 and the field lines 112.

In one example, the parasitic capacitance per MLU 102 is $$C = k e_0 A/d \qquad (6)$$

with K=3.9; vacuum permittivity $e_0$=8.86×10$^{-14}$ F/cm; area A=200 nm×100 nm; and distance d=50 nm. The total capacitance of multiple MLU's 102 is C multiplied by the total number of MLU's 102, and the cutoff frequency is 1/RC. This yields a maximum cutoff frequency of 400 GHz for a 10 mW 2,500×20 (Np=2,500, Ns=20) device operating with a swing voltage of 0.4 Volts; or 25 GHz for a 1,000×50 (Np=1,000, Ns=50) operating at 1 Volt. Separating the field line 112 into two field lines 112 in parallel and using a dielectric with K=2.5 may enhance the maximum cutoff frequency to about 1 THz. Other parasitic capacitances do exist so the actual cutoff frequency may be somewhat lower. However, these cutoff frequency values are larger than those of existing technologies.

In one example, and referring to FIGS. 1 and 2, the power added efficiency of the MLU amplification module 100 is Peff=(AC Pout)/DC Power. The DC power to operate the MLU device in a class C mode may be the multiplication of the bias voltage Vcc (see FIG. 9) by the DC current circulating through the output of the MLU amplification module 100 when all magnetic domains of the MLU's 102 are aligned (minimum resistivity). In one example, the maximum resistance of each MLU 102 (at a first phase of the AC signal) is approximately double the minimum resistance of each MLU 102 (at a second, opposite phase of the AC signal). This suggests that the power added efficiency may be about 50%. It may be advantageous to increase the power added efficiency above this value, such as by increasing the ratio between the resistance of the MLU 102 when the storage magnetization 146 and the sense magnetization 144 are aligned (e.g., substantially parallel) and the resistance of the MLU 102 when the storage magnetization 146 and the sense magnetization 144 are anti-aligned (e.g., substantially anti-parallel). It is contemplated that these resistance values, and in particular the ratio between these resistance values, may be varied for other embodiments of the MLU 102 based on forming the sense layer 104, the storage layer 106, and/or the layer 108 from different choices of materials, material concentrations, and/or material thicknesses. For example, a ratio of 75%-90% could significantly increase the power added efficiency.

The performance of the MLU's 102 can be characterized in terms of tunnel magnetoresistance (TMR). TMR can be expressed as:

$$\text{TMR}=((R\text{anti-parallel})-(R\text{parallel}))/(R\text{parallel}) \qquad (7)$$

For an Rparallel of 1 kOhm and an Ranti-parallel of 2 kOhm, the TMR is 100%, which may yield a power added efficiency that is below 50% class C. A TMR of 200% may yield a higher power added efficiency of 66%, and a TMR of 1000% may yield 90%. These higher TMR values may allow the MLU-based amplifier 200 to operate with a lower static DC bias current, minimizing power losses. Increasing TMR may also increase linearity.

Referring to FIG. 7, to efficiently extract heat to maintain the temperature of the MLU's 102 below the blocking temperature (such as below 150° C.) during amplification, the MLU's 102 may be spread out across a larger area, such as by increasing the separation of the MLU's 102 in each row and by increasing the spacing between the rows. On the other hand, to heat the MLU's 102 above the blocking temperature during configuration of the storage magnetizations 146, one or more of the following approaches may be used:

Increase the voltage 10 times above the normal operating voltage of the MLU's 102 during the heating cycle;

Increase the duration of the heating cycle;

Increase the external temperature of the die during factory programming by placing it in an heating device like an hot chuck, hot gas blower, lamp, etc.;

Place extra pins in the device that allow localized heating of pieces of the array of MLU's 102; and Use large external magnetic fields.

Referring to FIGS. 6, 7, and 10, the input field line 612 has a linear resistance Rin, a parasitic capacitance Cin, and a parasitic inductance Lin. Reduction of these losses can be achieved by one or more of the following:

Reduce the resistivity of the copper line forming the field line 612;

Increase the spacing between segments of the field line 612, if curving or serpentine, and/or between multiple field lines 612;

Use low k material as a dielectric between the segments of the field line 612 and/or between multiple field lines 612; and Insert a dummy absorbing layer between the segments of the field line 612 and/or between multiple field lines 612.

With regard to manufacturing and layout considerations, and referring to FIGS. 1, 2, and 4, the MLU-based amplifier 200 can be manufactured directly on substrates without CMOS with a total of 5-6 masking layers. In one embodiment, the process flow may include the following steps:

1> Planar dielectric deposition
Selective dry etch of the dielectric to form metal 1 interconnect (Mask 1)
Blanket cladding layer deposition
Blanket Cu deposition
CMP to finalize metal 1 (such as field line 112 and metal portions electrically connected to output line 116)
2> Planar dielectric deposition
Strap metal deposition (such as strap 120)
Selective etch of the strap (Mask 2)
3> Magnetic stack deposition (such as at least magnetic layers included in MLU's 102) (may include finishing by Tantalum)
Selective etch of the magnetic stack (Mask 3)
Dielectric filling
CMP to expose the magnetic stack and/or Tantalum finishing layer
4> Selective etch of vias connecting portions of metal 1 and metal 2 (mask 4)
5> Planar deposition of metal 2 (such as output line 116)
Selective etch of metal 2 (Mask 5)
6> Planar deposition of passivation (optional)
Selective etch of passivation (optional mask 6)

Referring to FIGS. 1 and 7, in one embodiment, the array of MLU's 102 includes a combination of two perpendicular comb-shaped metal layers. The first metal layer includes the input field line 112, and the second metal layer includes the output rows 708.

Referring to FIGS. 1 and 2, in one embodiment the MLU-based amplifier 200 may be a low-loss switch. For example, the stored magnetizations 146 may be configured in the opposite direction from input current flow in the field line 112 during switching operation to get substantially zero AC output, or may be configured in the same direction as input current flow in the field line 112 to get substantially full AC output. The programming cycle can be performed by applying a current high enough to heat MLU's 102 included in the MLU-based amplifier 200 above the blocking temperature, and a current to configure the storage magnetizations 146 in one direction or the opposite relative to the input current flowing through the field line 112 to get a pass or a no-pass.

Such a programming cycle can be below 1 ms. In one embodiment, the programming cycle can be performed prior to passing the input signal 130 through the field line 112. Alternatively or in addition, the programming cycle can be performed concurrently with passing the input signal 130 through the field line 112. In this way, the combined resistance of the of the MLU's 102 included in the MLU amplification module 100 can be configured to provide an output signal with two levels. For example, referring to FIG. 5, when the DC bias current 210 is configured to be a constant 10 mA applied through the output, the voltage drop is about 2.0 Volts (substantially full AC output) when all of the MLU's 102 are substantially aligned, and swings to about 4.0 Volts (substantially zero AC output) when all of the MLU's 102 are substantially anti-aligned.

Referring to FIGS. 1, 2, and 5, and in one embodiment, the MLU's 102 may experience hysteresis. In particular, the magnitude of the input current 130 that aligns the storage magnetization 146 and the sense magnetization 144 to be substantially parallel as the input current 130 is increasing may be greater than the magnitude of the input current 130 that flips the storage magnetization 146 and the sense magnetization 144 back to be substantially anti-parallel as the input current 130 is decreasing. For example, if the mid-point input current 130 is 2 mA, it may take 2.1 mA to align the magnetizations to be substantially parallel as the input current 130 increases, and 1.9 mA to flip the magnetizations to be substantially anti-parallel as the input current decreases. For this degree of hysteresis, the MLU-based amplifier 200 may operate with a peak current of 0.2 mA.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. An apparatus, comprising:
a circuit including a magnetic tunnel junction including a storage layer and a sense layer; and
a field line configured to generate a magnetic field based on an input signal, wherein the magnetic tunnel junction is configured such that a magnetization direction of the sense layer and a resistance of the magnetic tunnel junction vary based on the magnetic field;
wherein the circuit is configured to amplify the input signal to generate an output signal that varies in response to the resistance of the magnetic tunnel junction and
wherein the magnetic tunnel junction is included in a plurality of magnetic tunnel junctions included in the circuit, and further comprising a feedback circuit configured to control linearity of amplification of the input signal by adjusting current flow through the field line to set a combined resistance of the plurality of magnetic tunnel junctions.

2. The apparatus of claim 1, wherein:
the magnetic tunnel junction is included in a plurality of magnetic tunnel junctions included in the circuit; and
the circuit is configured to generate the output signal based on a combined resistance of the plurality of magnetic tunnel junctions.

3. The apparatus of claim 1, wherein a bias point of the circuit is configured to substantially maximize gain of the circuit.

4. An apparatus, comprising:
a circuit including a magnetic tunnel junction including a storage layer and a sense layer; and
a field line configured to generate a magnetic field based on an input signal, wherein the magnetic tunnel junction is configured such that a magnetization direction of the sense layer and a resistance of the magnetic tunnel junction vary based on the magnetic field;
wherein the circuit is configured to amplify the input signal to generate an output signal that varies in response to the resistance of the magnetic tunnel junction and
wherein a bias point of the circuit is configured to substantially minimize power consumption of the circuit while maintaining substantially linear operation of the circuit.

5. The apparatus of claim 4, wherein:
the magnetic tunnel junction is included in a plurality of magnetic tunnel junctions included in the circuit, the plurality of magnetic tunnel junctions including a plurality of subsets connected in parallel, wherein each of the plurality of subsets includes multiple magnetic tunnel junctions connected in series; and
the circuit is configured to generate the output signal based on the combined resistance of the plurality of magnetic tunnel junctions.

6. The apparatus of claim 5, wherein the combined resistance of the plurality of magnetic tunnel junctions is pre-configured for output impedance matching.

7. The apparatus of claim 4, wherein a magnetization direction of the storage layer is configurable by current flow through the field line during a configuration operation.

8. The apparatus of claim 7, wherein the magnetization direction of the storage layer is configured such that the magnetization direction of the sense layer is switchable based on current flow through the field line during amplification of the input signal.

9. The apparatus of claim 4, wherein:
a magnetization direction of the storage layer is pre-configured; and
a direction of current flow through the field line is configured such that the magnetization direction of the sense layer is switchable based on the current flow through the field line.

10. The apparatus of claim 4, wherein:
the magnetic tunnel junction is included in a plurality of magnetic tunnel junctions included in the circuit, each of the plurality of magnetic tunnel junctions including a storage layer and a sense layer; and
the magnetization direction of the storage layer of the each of the plurality of magnetic tunnel junctions is pre-configured based on a shape of the field line.

11. The apparatus of claim 4, wherein the field line is curved.

12. The apparatus of claim 4, wherein the field line is serpentine.

13. An apparatus, comprising:
a circuit including a magnetic tunnel junction including a storage layer and a sense layer; and a field line configured to generate a magnetic field based on an input signal, wherein the magnetic tunnel junction is configured such that a magnetization direction of the sense layer and a resistance of the magnetic tunnel junction vary based on the magnetic field;

wherein the circuit is configured to amplify the input signal to generate an output signal that varies in response to the resistance of the magnetic tunnel junction and wherein a thickness of the field line is pre-configured for input impedance matching.

14. The apparatus of claim 13, wherein:

the magnetic tunnel junction is included in a plurality of magnetic tunnel junctions included in the circuit;

the plurality of magnetic tunnel junctions are connected in series;

the field line has a first lateral edge, a second lateral edge opposite the first lateral edge, and a first end;

at least a portion of each of the plurality of magnetic tunnel junctions is disposed between the first lateral edge and the second lateral edge of the field line; and each of the plurality of magnetic tunnel junctions is disposed substantially the same distance from the first end of the field line.

15. The apparatus of claim 13, wherein a magnetization direction of the storage layer is pre-configured by at least one of an external field current and an external heating mechanism.

16. The apparatus of claim 13, wherein a magnetization direction of the storage layer is pre-configured by at least one of the field line and an internal heating mechanism.

17. The apparatus of claim 13, wherein a magnetization direction of the storage layer is pinned during processing by the circuit.

* * * * *